United States Patent [19]

Butler

[11] Patent Number: 5,075,817
[45] Date of Patent: Dec. 24, 1991

[54] TRENCH CAPACITOR FOR LARGE SCALE INTEGRATED MEMORY

[75] Inventor: Douglas B. Butler, Colorado Springs, Colo.

[73] Assignee: Ramtron Corporation, Colorado Springs, Colo.

[21] Appl. No.: 542,573

[22] Filed: Jun. 22, 1990

[51] Int. Cl.$^5$ .................. H01L 21/283; H01L 29/78
[52] U.S. Cl. .................................. 361/313; 29/25.42; 357/23.6; 437/52
[58] Field of Search ..................... 361/311, 312, 313; 29/25.42; 357/41, 51, 54, 55, 23.6; 437/46, 47, 48, 52

[56] References Cited

U.S. PATENT DOCUMENTS

| | | | |
|---|---|---|---|
| 4,123,300 | 10/1978 | Joshi et al. | 437/52 X |
| 4,513,304 | 4/1985 | Takemae | 357/23.6 |
| 4,688,063 | 8/1987 | Lu et al. | 357/23.6 G |
| 4,704,705 | 11/1987 | Womack | 357/23.6 G X |
| 4,721,987 | 1/1988 | Baglee et al. | 357/41 X |
| 4,804,636 | 2/1989 | Groover et al. | 437/48 X |
| 4,918,503 | 4/1990 | Okuyama | 437/52 X |

FOREIGN PATENT DOCUMENTS

72150 4/1988 Japan .................... 357/23.6 G

Primary Examiner—Donald A. Griffin
Attorney, Agent, or Firm—Edward D. Manzo

[57] ABSTRACT

A trench capacitor which has a plurality of capacitor plates separated by a dielectric within a trench on a substrate. A plate located closest to the wall of the trench may be a field shield and tied everywhere to ground. The other plate may be polysilicon. Said other plate may be tied to a source of variable potential. A plurality of sacrificial layers are established over the structure and the structure thus formed is then patterned and etched. A pass transistor is formed adjacent to the trench capacitor, and a connecting layer is established connecting the other plate of the trench capacitor to the source/drain region of the pass transistor. The connecting layer makes electrical contact to the other capacitor plate and source/drain of the pass transistor and is insulated from other layers in the capacitor and pass transistor. Bit lines and word lines can then be added, as known in the art.

56 Claims, 4 Drawing Sheets

TRENCH CAPACITOR FOR LARGE SCALE INTEGRATED MEMORY

FIELD OF THE INVENTION

This invention relates generally to the field of integrated circuits, and more specifically to an improved trench capacitor for high density dynamic random access memory integrated circuits.

BACKGROUND OF THE INVENTION

Recently, integration of circuits on one chip has increased dramatically. In the area of dynamic random access memory (DRAM), memory capacity on one chip has moved beyond the 64 kilobit capacity through the 1 megabit and now into 4 megabits of RAM on one chip. In order to achieve a 4 megabit DRAM on one chip several major problems must be overcome.

Figure 1:
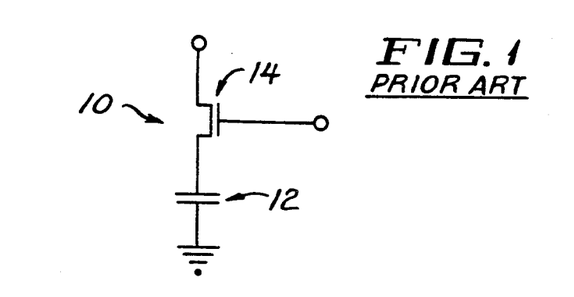
FIG. 1 is a schematic diagram of a typical DRAM memory cell.

Each memory cell in a DRAM at the basic bit level generally comprises one capacitor and one transistor, as shown in FIG. 1, although the actual circuit may vary greatly depending on the desired capacity, materials, etc. In building large capacity DRAMs, capacitors formed in trenches or "trench capacitors" are used in order to reduce the total surface area needed for one cell, thereby to pack the memory cells more densely. Trench capacitors, as known in the art, can be constructed by etching a cylindrical or other shape well or trench into a (usually silicon) wafer substrate, lining the trench with a dielectric layer and filling the remaining volume of the trench with a polysilicon plug. The trench wall and the plug serve as the two plates of the capacitor to store the electrical charge.

There are several tradeoffs required to obtain a high density of trench capacitors. Since the electrical charge of a trench capacitor is stored between the trench wall and the plug, if the trenches are too close together, there may be capacitive coupling between the trench wall of one trench with the trench wall of an adjacent trench. Furthermore, there may also be leakage of current from one trench wall to an adjacent trench wall through the silicon substrate, because a high voltage on one trench wall will tend to cause charge flow through the silicon substrate towards a low voltage on an adjacent trench wall. As a result, trench capacitors generally must be constructed approximately 1.8 microns apart or more.

These problems are well known in the art. In response to them, trench spacing has become a function of substrate doping; that is, the greater the doping of the substrate, the closer together the trenches may be. The high concentration of dopant provides an energy barrier between the trenches. However, if the substrate adjacent to the trench is highly doped, then the substrate under the gate transistor is also highly doped. A high performance pass transistor with low body effect, as is desirable in a high performance memory device, is then very difficult to construct, because the body effect of a transistor increases as the doping of the substrate increases. As a result, the full voltage of the bit line cannot be delivered to the capacitor through a high body effect transistor.

Finally, if one capacitor plate of polysilicon is formed next to a single crystal silicon substrate, a gated diode results, as is well known in the art. Such gated diode generally increases current leakage along and through the sidewall of the trench.

Therefore, it is a general object of this invention to overcome the above-listed problems.

It is a further object of this invention to provide a trench capacitor which requires a minimal amount of etching and fine alignment.

It is a further object of this invention to provide a trench capacitor which may be manufactured using standard processing techniques.

SUMMARY OF THE INVENTION

This invention provides an apparatus and method for manufacturing a trench capacitor, preferably for use in a DRAM integrated circuit. The trench capacitor of the present invention comprises two capacitor plates separated by a dielectric formed within a trench formed in a substrate. A first plate may be formed on the wall of the trench and preferably comprises a field shield coupled to ground. The dielectric illustratively comprises silicon nitride. The second plate may illustratively comprise polysilicon. At least some of the layers extend out of the trench and include, outside the trench, a lateral portion. Preferably, several sacrificial layers are established over the trench capacitor, and the multi-layer structure thus formed is etched to form steps outside of the trench. A pass transistor is formed adjacent to the trench capacitor, and a contact layer is established over the steps to couple the trench capacitor to the pass transistor source. Bit lines and word lines are added.

It will be understood that an important aspect of the invention is the structure, fabrication, or use of a trench capacitor that reduces the effects of voltage being stored in the capacitor vis-a-vis the substrate. Much of the prior art has a doped region within the substrate next to the trench, which forms part of the trench capacitor. The present invention avoids this.

The structure of the present invention in some of its aspects therefore includes a DRAM memory cell having a trench capacitor in a trench in a substrate. A transistor is formed beside but now within the trench. The transistor selectively couples data to be stored in the cell to the capacitor. The trench capacitor has an active plate layer, a dielectric layer, and a field plate layer coupled to a reference potential, with the field plate layer also serving to isolate adjacent memory cells, and with the dielectric layer positioned between the plate layers. An insulation layer is located between the field plate layer and the substrate and further located between the field plate and side walls of the trench. The active plate layer is coupled to the transistor, with voltages on the active layer being insulated from the substrate by the substrate by the field plate layer and the insulating layer. The invention also includes the process of forming such a structure.

The invention also includes a method of operating a DRAM memory cell comprising the steps of: (1) actuating a pass transistor thereby to couple a data signal representing data to a trench capacitor from an electrode of the transistor; (2) impressing the signal on an active plate electrode of the trench capacitor; and (3) isolating the signal from the substrate and side walls of the trench by maintaining a further plate of the capacitor at a reference potential, said further plate being positioned between the active plate electrode and the side walls of the trench, and insulating said further plate from the substrate and the trench side walls by a layer of insulation, so that the signal coupled to the active plate has no effect on the substrate or trench side walls.

BRIEF DESCRIPTION OF THE DRAWINGS

The invention, together with its objects and the advantages thereof, may best be understood b reference to the following detailed description taken in conjunction with the accompanying drawings of which.

DETAILED DESCRIPTION OF THE PREFERRED EMBODIMENT

The preferred embodiment of this invention will be described in connection with the simplistic memory cell model of FIG. 1. It is to be understood that the trench capacitor of this invention may be modified to suit the requirements of other memory circuits without departing from the scope of this invention. In FIG. 1, a memory cell is generally denoted by the number 10. Memory cell 10 generally comprises a capacitor 12 and a pass transistor 14. Capacitor 12 is configured to have a first plate coupled to ground and a second plate coupled to a drain of the pass transistor 14. A source and gate of the pass transistor 14 are coupled to the bit line and word line, respectively, as is known in the art. The transistor 14 may comprise an enhancement or depletion type FET or other switching device.

Figure 2:
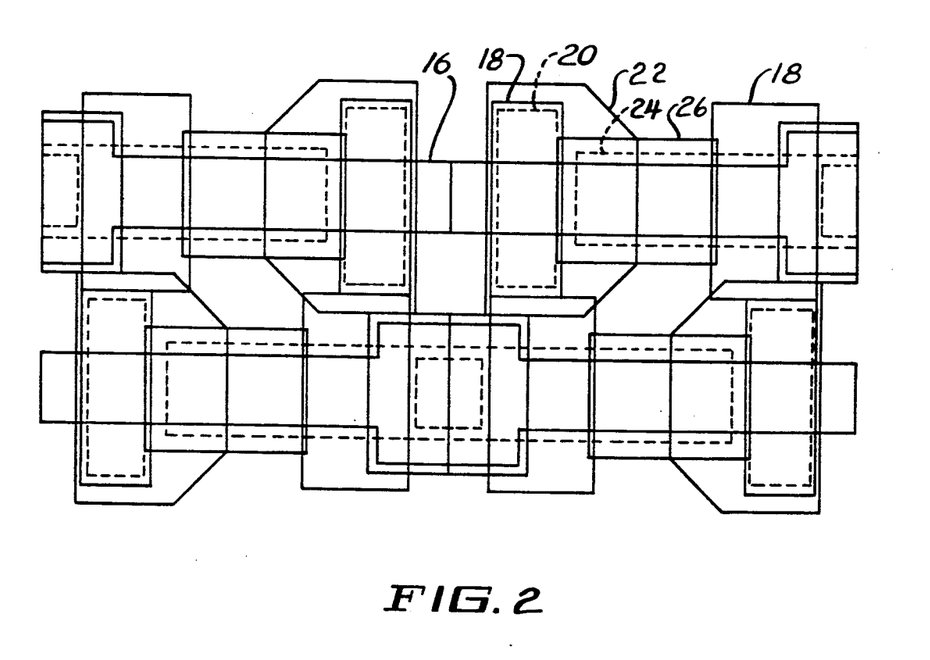
FIG. 2 is a plan view of a region of memory cells built according to the preferred embodiment of this invention.

Turning now to FIG. 2, a plan view is shown of a portion of memory array constructed according to the preferred embodiment of this invention, showing four memory cells 10. The array of course contains millions of such cells, and FIG. 2 is merely illustrative. Each memory cell 10 in this array includes a capacitor 12 and a pass transistor 14, constructed according to the preferred embodiment of this invention. Also shown in FIG. 2 are each memory cell's associated bit lines or local interconnect 16 and word lines 18. A trench is shown at 20 with a cell capacitor definition shown at 22 over trench 20. The cell capacitor definition 22 is generally defined by mask at M-1, as will be described below. 24 generally denotes an opening in a mask M-2, as will also be described below. Pass transistor 14 is generally defined by the intersection of 24 and 18. The cell capacitor is defined by 22. Feature 26 is a conductive layer which connects the cell capacitor 12 to the source/drain of transistor 14. Details of this connection are described below.

Figure 3:
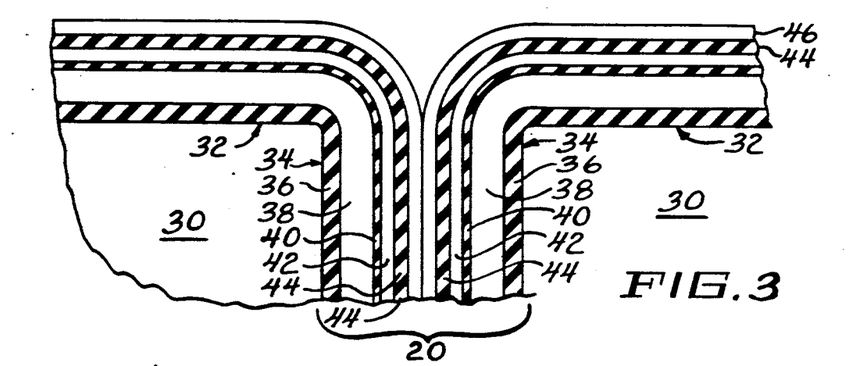
FIG. 3 is a representational cross-section of the top of a trench at an intermediate step of construction of the preferred embodiment of this invention.

Referring now to FIG. 3, an illustration of the preferred embodiment of this invention is shown after several steps of processing are substantially complete. The construction of the preferred embodiment of this invention begins with a substrate or wafer 30 formed preferably of single crystal silicon that is P doped, as known in the art. Other substrates can be used, and the P doping could be varied. A trench 20 is formed preferably by etching through the upper surface 32 of the substrate 30 into the substrate 30 using standard processing techniques, forming walls 34 and a floor (not shown in these figures), as known in the art. The dimensions of the trench preferably are 0.7 microns (nominally) by 2 microns by 3 microns deep. After trench 20 is etched, walls 34 may optionally be doped, but in the preferred method and structure, the walls are not doped. The trench 20 is then cleaned as is known in the art, in this embodiment using an oxide etch in buffered H.F.

A field shield will then be formed both in the trench 20 and on the upper surface 32 of substrate 30 in this embodiment. The field shield may be generally constructed according to the method described in U.S. Pat. No. 4,570,331 to S. Sheffield Eaton, Jr. et al., or variations thereof. Accordingly, a field shield implant is performed in this embodiment on the upper surface 32 of the substrate 30 prior to the etching of the trench 20, which adjusts the threshold voltage of both the active pass transistor 14 and the field shield isolation transistor. The field shield itself preferably comprises two layers. First, a field shield oxide layer 36 is established, preferably by being grown directly on the substrate in a 920° Celsius wet $O_2$ atmosphere to a thickness of approximately 62 nm. A field shield polysilicon layer 38, doped to greater than $10^{20}/cm^3$ with phosphorus is then deposited via means known in the art over field oxide layer 36 to a thickness of approximately 0.15 micron in this preferred embodiment.

The field shield will be common to all capacitors and will be coupled everywhere to ground in the preferred embodiment by being coupled to VSS somewhere. However, the field shield may be tied to any source of stable electrical potential on the memory circuit. The field shield provides isolation of the memory cell and prevents leakage of current through the single crystal silicon between adjacent memory cells. The field shield also acts as a first plate of the memory cell capacitor in this embodiment. By this method, a capacitor is formed within a trench, which acts as a mechanical structure instead of an electrical component. Having the plate adjacent to the substrate and held at a constant potential eliminates the gated-diode effect discussed above, thus enhancing electrical isolation of the trench capacitor. Furthermore, the substrate does not have to be doped as heavily as is common in the prior art and discussed above in connection with the background of the invention.

Next, a cell dielectric layer 40 is deposited or grown over the field shield layers. Dielectric 40 preferably comprises silicon nitride, preferably deposited via chemical vapor deposition to a thickness of approximately 0.018 microns. The cell dielectric 40 may vary in composition and/or thickness according to the desired capacitance of the capacitor device, as is known in the art.

Next, in the preferred method an oxidation step is performed which oxidizes the cell dielectric layer 40 to repair any gap in the nitride dielectric layer and to form a silicon oxide layer in order to reduce the conductivity of the stack.

Next, a second plate layer 42 is formed by means known in the art. In this embodiment, second plate layer 42 preferably comprises conductive doped polysilicon deposited by chemical vapor deposition to a thickness of approximately 0.15 microns, preferably in an ASM vertical furnace using disilane ($Si_2H_6$) and phosphene ($PH_3$) which produces a phosphorus doping of greater than $10^{20}/cm^3$ in the polysilicon. Second plate layer 42 may be connected to the source/drain of the pass transistor 14 which will be described below, in connection with FIGS. 7 and 8.

Next, a stop oxide layer 44 is formed, preferably by deposition. Stop oxide layer 44, as its designation implies, comprises a sacrificial layer that will be used as described below in connection with FIGS. 7 and 8. Stop oxide layer 44 in this embodiment may be an insulating material comprising silicon dioxide deposited to a thickness of approximately 60 nm.

The next layer of this embodiment preferably comprises a stop polysilicon layer 46. However, stop polysilicon layer 46 may not be necessary in other embodiments, depending upon the desired final structure. Stop polysilicon layer 46 comprises undoped polysilicon, deposited to a thickness of approximately 100 nm. This layer effectively fills the trench opening, as illustrated in FIG. 3.

Optionally, any remaining volume of trench may be filled with a plug. The plug may comprise silicon dioxide or polysilicon. The plug would be etched until its upper surface is approximately level with the top of the stop polysilicon layer 46 which includes an exposed lateral region.

Thus it will be seen that in the preferred embodiment as thus far described, a trench is created and filled with layers alternately of dielectric and polysilicon. These layers extend from inside the trench to the surrounding lateral surface regions.

Figure 4:
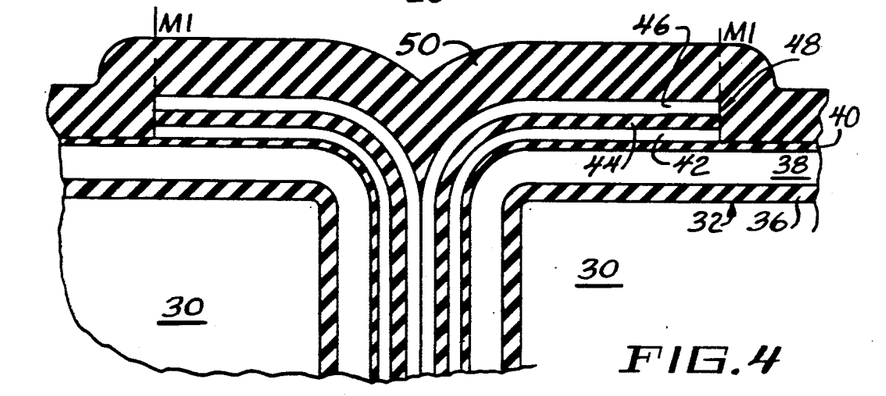
FIG. 4 is a representational cross-section of the trench at a step subsequent to FIG. 3, wherein certain layers have been etched, and additional layers have been established.

Turning now to FIG. 4, a trench capacitor constructed according to the preferred embodiment of the present invention is shown after further processing. It will be seen from FIG. 5 that the alternating layers will be defined at two locations, M-1 and M-2, on the "lateral" portions of the layers rather than in the trench itself.

A first step 48 (FIG. 4) which corresponds to 22 (FIG. 2) is formed adjacent to the trench. In the preferred method, a mask is formed of photoresist (not shown) as is known in the art over the structure of FIG. 3, wherein M-1 in FIG. 4 denotes the edge of the mask. Stop polysilicon layer 46 is etched using an anisotropic dry etch well known in the art that will stop on oxide 44. Stop oxide layer 44 next is etched using an anisotropic dry etch that will stop on polysilicon, which in this embodiment comprises second plate polysilicon layer 42. Polysilicon layer 42 is then etched via means essentially similar to that used to etch stop polysilicon layer 46 such that the etch will stop on the silicon nitride of cell dielectric layer 40, thus forming a first "step" 48. The photoresist used to form the mask is then stripped.

An oxide layer 50 may then be grown or, as in the preferred embodiment, deposited by means known in the art to a thickness of approximately 0.2 microns. The structure thus created may then be subjected to densification by standard techniques, as described above. The resulting structure is shown in FIG. 4.

Figure 5:
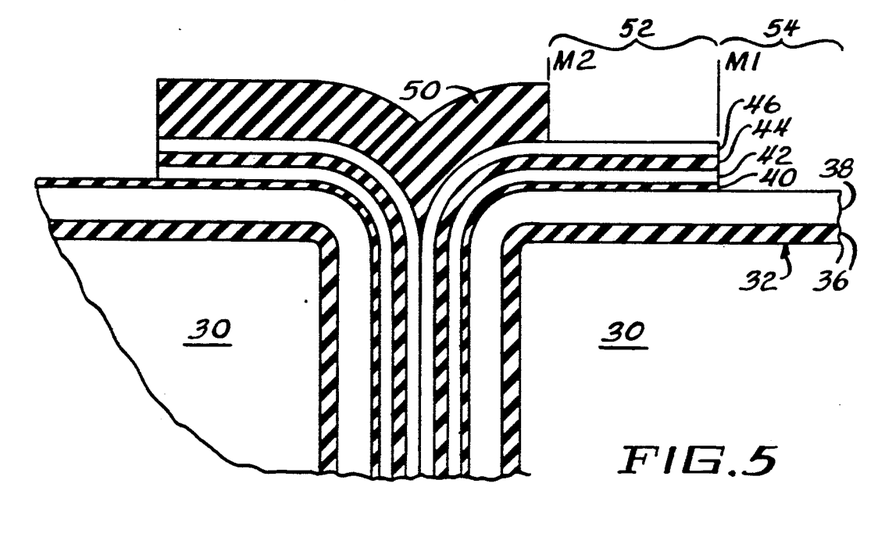
FIG. 5 is a representational cross-section of the trench at a step subsequent to FIG. 4 illustrating a multilayered or stepped structure according to one aspect of this invention.

Turning now to FIG. 5, the structure created in FIG. 4 is further masked and etched. First, oxide layer 50 is masked with photoresist so that trench 20 is covered with photoresist that extends beyond the trench 20 to line M-2, which denotes the edge of the mask. Layer 24 (FIG. 2) corresponds to the opening in photoresist mask M2. It will be noted that M-2 is closer to the trench than M-1. The distance from M-2 to M-1 is approximately 0.7 microns in the preferred embodiment. Next an etch of the exposed portions of oxide layer 50 is performed, stopping on the stop polysilicon layer 46 in a first region 52 defined by lines M-1 and M-2. This etch also etches in a second region 54 (adjacent to region 52) through oxide 50 and then through the cell dielectric 40, stopping on the top surface of field shield polysilicon layer 38. After the photoresist is stripped, the result is shown in FIG. 5. Thus, it will be seen that a second step (at M-2) has now been formed between the first step (at M-1) and the side of trench 20.

The next operation is preferably an anisotropic plasma polysilicon etch, which etches two different polysilicon member simultaneously in the preferred embodiment. One polysilicon member that is etched is the stop polysilicon layer 46 exposed between lines M-1 and M-2. The other is the exposed field shield polysilicon layer 38 to the right of line M-1. At this time, field shield oxide 36 still covers the top surface 32 of silicon substrate 30. Thus, the etch stops on oxides 44 and 36.

Figure 6:
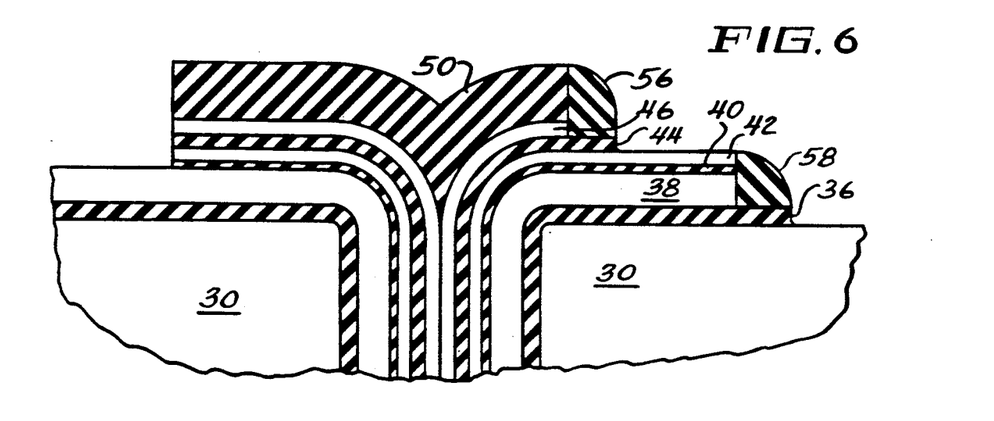
FIG. 6 is a representational cross-section of the trench at a step subsequent to FIG. 5 illustrating the position of insulating "sticks" as used in the invention.

A further oxide layer (not shown) may be deposited by means known in the art over the entire structure thus formed to a thickness of 0.20 microns, illustratively. The further oxide layer and the oxides 44 and 36 exposed in the prior step may then be anisotropically etched using a low-silicon-damage etch, so that only a pair of spacer sticks 56 and 58 (FIG. 6) are left at the steps created at M-1 and M-2. Thus, each oxide spacer stick 56, 58 has a substantially vertical sidewall nearest the trench, i.e., at M-1 and M-2, respectively. The structure thus created may again be subjected to densification depending on the type of oxide deposition used. In the preferred embodiment, densification is not needed because the oxide used is deposited at a high temperature on the order of 800° C. The resulting structure is shown in FIG. 6.

It will be seen that oxide layer 36 extends to the outer edge of spacer stick 58. The body of stick meets and insulates the outer edges of first plate 38, dielectric 40, and second plate 42, all at the "first step" M-1. Similarly, oxide 44 extends to the outer edge of spacer stick 56, the body of which meets and insulates the edges of poly 46 and oxide 50 at second step M-2. Between the first and second steps, a lateral expanse of second plate 42 is exposed; the remaining structure is covered by oxide, except for part of the substrate 30.

Figure 7:
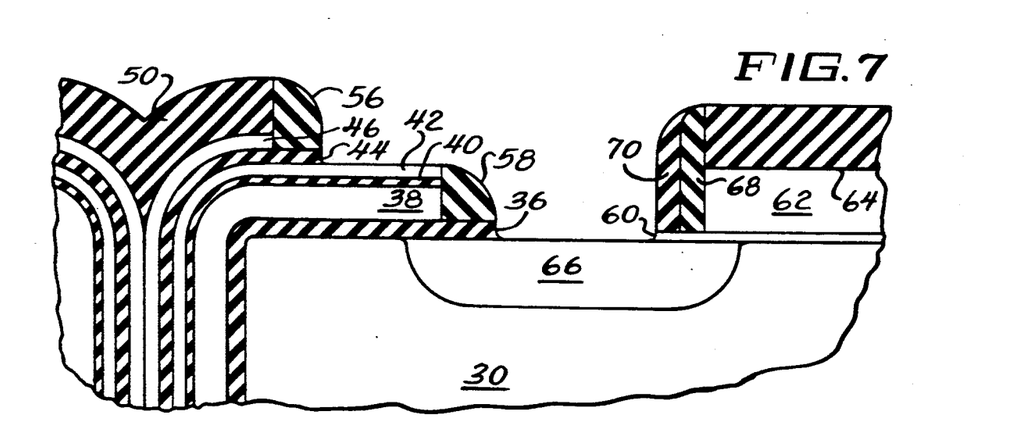
FIG. 7 is a representational cross-section of parts of a trench capacitor memory cell according to this invention showing the construction of a pass transistor.

Turning now to FIG. 7, a gate oxide layer 60 is grown or otherwise established on exposed silicon to a thickness of 20 nm. Next, a gate polysilicon layer 62 is deposited over the entire surface to a thickness of approximately 0.2 microns. Next, a gate poly oxide layer 64 is deposited to a thickness of approximately 0.2 microns over gate polysilicon layer 62. This structure is then densified at 920° C. for 10 minutes in a dry $O_2$ atmosphere in the preferred embodiment.

The structure thus created is masked with a photoresist and etched. First, gate poly oxide layer 64 is etched, stopping on the polysilicon layer 62, the photoresist is then stripped and the gate polysilicon layer 62 is etched, stopping on gate oxide 60 and field oxide 50.

Next, a 50 nm first spacer oxide layer (not shown) is deposited over the surface of the structure. A lightly doped drain (LDD) region 66 is then defined via masking. The LDD region 66 in the preferred embodiment of this invention is an N+ doped region which results from implanting phosphorous at a dose of approximately $1 \times 10^{14}$ per $cm^2$ and an energy level of 60 keV through the first spacer oxide layer. A second spacer oxide layer (not shown) is then deposited to a thickness of approximately 0.1 microns. Both spacer oxide layers are then etched anisotropically leaving sticks 68 and 70 as shown in FIG. 7.

Thus, at this point in the process, a gate electrode has been created with an insulated side wall (facing the steps at M-1 and M-2). Between the gate electrode and the steps is an exposed upper surface of the substrate 30, in which an LDD implant has been done.

Source-drain regions for both n-channel and p-channel transistors are then formed on other regions of the wafer using methods which are known in the art.

Figure 8:
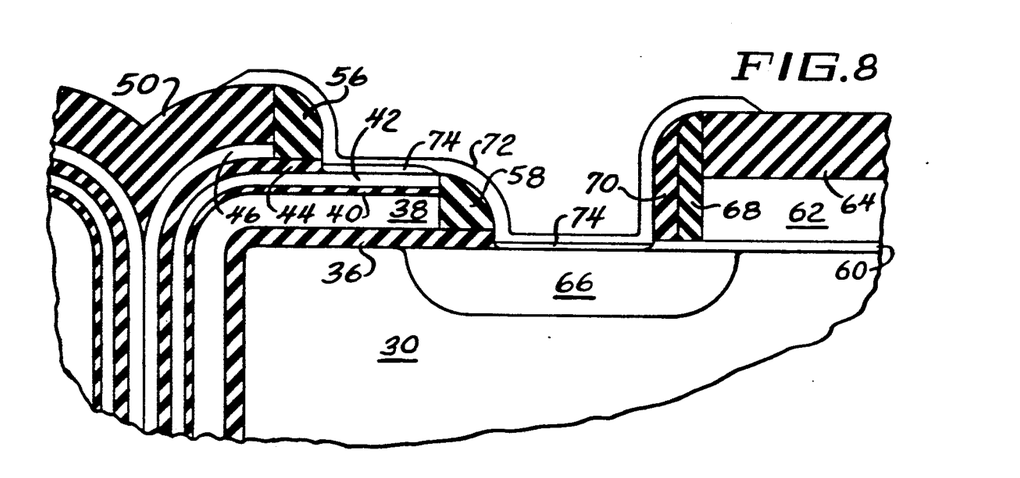
FIG. 8 is a representational cross-section of a completed trench capacitor memory cell constructed according to this invention.

Turning now to FIG. 8, a 20 nm titanium layer is next deposited over the entire structure of FIG. 7. A titanium nitride layer 72 may then be formed over the non-silicon regions while a titanium silicide layer 74 is formed under the titanium nitride where the titanium contacts polysilicon 42 or substrate 30. A 50 nm titanium nitride layer is then sputtered onto the structure. A masking silicon nitride ($Si_3N_4$) is then deposited by chemical vapor deposition, to a thickness of 50 nm. The structure is masked with photoresist covering area 26 (FIG. 2) corresponding to the extend of 72 (FIG. 8). Next, the exposed areas of the silicon nitride are etched with a dry, isotropic plasma etch, stopping on the underlying titanium nitride layer. The photoresist layer is stripped and the silicon nitride is used as a mask while etching the exposed portions of the titanium nitride layer, stopping on the titanium silicide layer 74.

By forming a memory cell according to the preferred embodiment of this invention, sticks 56, 58, 68 and 70 prevent the contact/barrier layer or region of titanium nitride (which is conductive) from contacting and hence electrically connecting to certain other conductive layers—specifically the field shield layer which is tied to ground and the gate polysilicon layer 62 which is the word line 18. However, the titanium silicide and titanium nitride operate to couple the second capacitor plate electrode 42 (which was exposed between the two steps) to the source/drain region 66. This corresponds to FIG. 1 where the upper capacitor plate is coupled to the source/drain of FET 14.

Consequently, the contact/barrier layer may be deposited without etching contact windows. By using sacrificial layers formed into steps in combination with insulating sticks, a self-aligned contact layer has been established.

Next, nitride can be deposited to a depth of approximately 0.03 microns. A BPSG layer 76 (FIG. 9) may then be deposited to a thickness of approximately 0.6 microns over the entire structure, as is commonly done in the art. Bit lines 16, as are known in the art, are then formed.

Figure 9:
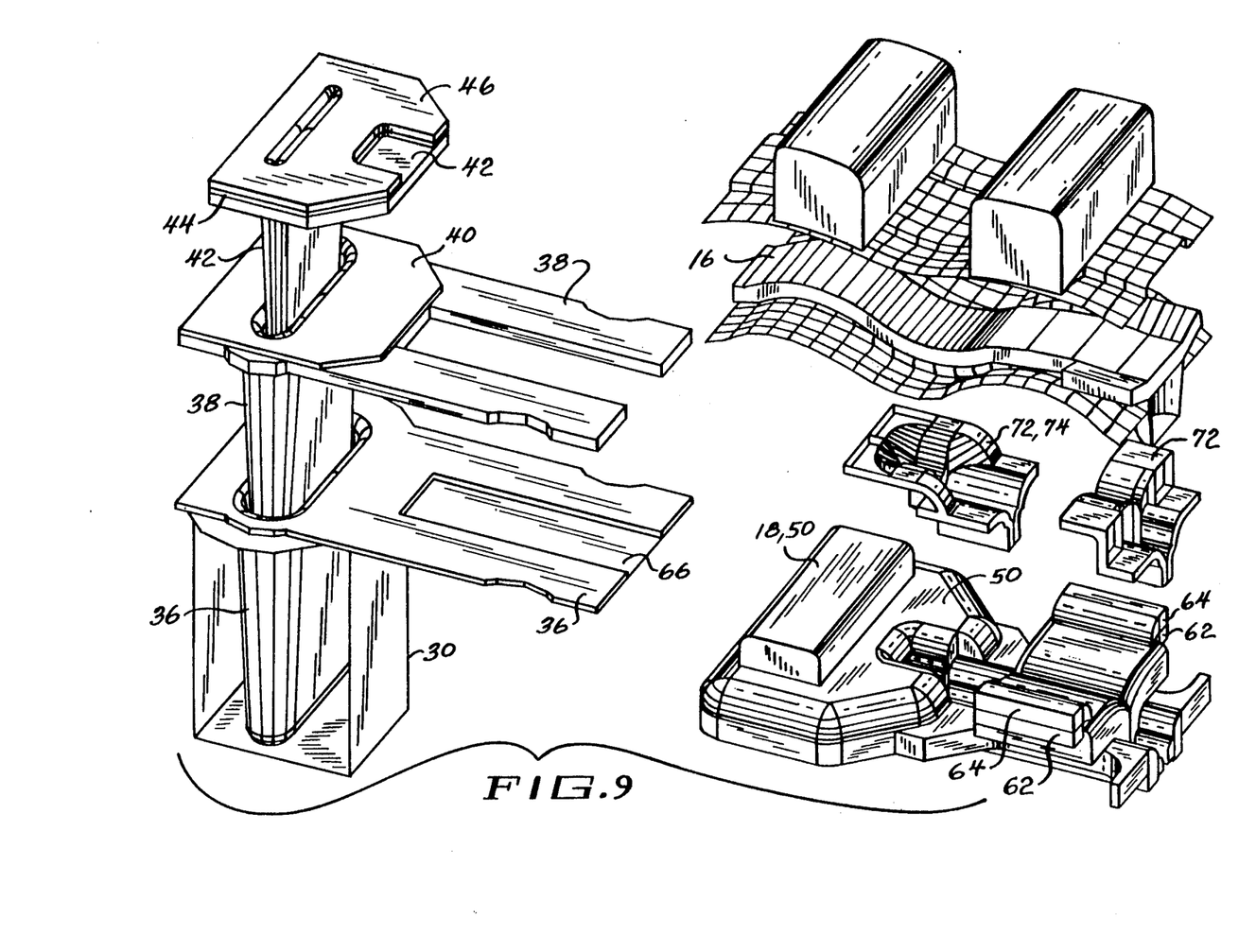
FIG. 9 is an exploded, three-dimensional perspective view of a trench capacitor memory cell constructed according to this invention.

Turning now to FIG. 9, a memory cell 10 built according to the preferred embodiment of this invention is shown in an exploded, three dimensional view. The trench 20 and lower layers are generally shown on the left and the pass transistor 14 and upper layers are shown on the right. It is to be understood that the various layers on the right fit over top of the layers on the left.

It will be seen that in FIG. 9 the side walls of the trench are not shown as precisely parallel but rather at a slight angle. It will be understood therefrom that in the practice of this invention, an opposing pair of side walls of the trench can be perpendicular to the substrate upper surface as depicted in FIGS. 3 to 8, and thus exactly parallel to each other, or they may depart from being exactly parallel to one another. It will also be understood that the trench may contemplate a pair of rounded walls, which also are illustrated in FIG. 9.

Although the present invention has been described herein terms of the preferred embodiment, it is envisioned that the scope and spirit of the present invention encompasses such changes and minor alterations as would normally be apparent to one skilled in the art and familiar with teachings of this specification.

I claim:

1. A trench capacitor for an integrated circuit on a substrate, said trench capacitor comprising:
   a trench in said substrate, said trench including a pair of opposing side walls and bottom;
   a first plate layer located between said side walls of the trench said first plate layer being electrically coupled to a source of stable electrical potential;
   an insulating layer positioned between the first plate layer and the side walls of the trench, insulating the first plate layer from the substrate;
   a dielectric layer located between the side walls of the trench said first plate layer being positioned between the trench side walls and the dielectric layer; and
   a second plate layer located between the side walls of the trench, the dielectric layer and first plate layer being positioned between the trench side walls and the second plate layer, the second plate layer being coupled to a variable electrical potential representative of data to be stored in the capacitor, so that said first plate layer, said dielectric layer and said second plate layer form a capacitor within said trench insulated from the substrate and the trench side walls.

2. The trench capacitor of claim 1 wherein said first plate layer and said second plate layer each comprise polysilicon.

3. The trench capacitor of claim 1 wherein said first plate layer comprises a field shield layer coupled to a reference potential.

4. The trench capacitor of claim 1 wherein said dielectric layer comprises an oxidized silicon nitride.

5. The trench capacitor of claim 1 wherein said layers fill the volume of said trench.

6. The trench capacitor of claim 1 further including a plug filling the remaining volume of said trench after all other layers are established.

7. The trench capacitor of claim 6 wherein said plug comprises polyusilicon.

8. The trench capacitor of claim 6 wherein said plug compri

9. The trench capacitor of claim 1 further including one or more sacrificial layers similarly shaped to and located over said second plate layer, said sacrificial layers being used during further processing of said trench capacitor to facilitate connection of said trench capacitor to a source/drain of a pass transistor.

10. The structure of claim 1 wherein each of said first plate layer, said dielectric layer, and said second plate layer includes a respective generally flat portion located within the trench, between and substantially parallel to the side walls of the trench.

11. The structure of claim 10 wherein each of said first plate layer, dielectric layer, and second plate layer include respective left and right generally flat portions located within the trench, between and substantially parallel to the side walls of the trench, the left portions being generally parallel to the right portions within the trench.

12. The structure of claim 1 wherein each of said first plate layer, dielectric layer, and second plate layer have respective upper and lower portions, all of the upper portions being located above and extending generally parallel to the upper surface of the substrate, the lower portions depending downwardly from the upper portions into the trench.

13. The structure of claim 12 further including one or more sacrificial layers established over said second plate layer, said sacrificial layers being used during further processing of said trench capacitor to facilitate connection of said trench capacitor to a source/drain of a pass transistor.

14. The structure of claim 13 wherein said sacrificial layers comprise at least two sacrificial layers, the first of the two sacrificial layers comprising polysilicon and the second sacrificial layer comprising silicon oxide.

15. The structure of claim 12 further comprising a layer of TiN located outside the trench and electrically coupling said second plate to a pass transistor source/drain region.

16. The trench capacitor of claim 1 wherein said first plate layer comprises a field shield layer and wherein said dielectric layer and second plate layer are similarly shaped to the first plate layer.

17. The trench capacitor of claim 16 wherein said first and second plate layers and said dielectric layer all extend from the trench to locations above the top surface of the substrate.

18. A method for forming an integrated circuit memory cell capacitor on a substrate comprising:
forming a trench in said substrate, the trench having at least one pair of opposing side walls;
establishing an insulating layer within said trench;
establishing a first capacitor plate layer having a portion located between and substantially parallel to the side walls of the trench over said insulating layer;
coupling said first capacitor plate layer to a reference potential;
establishing a dielectric layer having a portion between and substantially parallel to the side walls of the trench and over said first capacitor plate layer; and
establishing a second capacitor plate layer having a portion between and substantially parallel to the side walls of the trench and over said dielectric layer, so that said first capacitor plate, said dielectric and second capacitor plate form a capacitor within said trench but insulated from the trench side walls and the substrate.

19. The method according to claim 18 further including the step of filling the remaining volume of said trench after all of said previous layers have been established.

20. The method of claim 18 further comprising the step of establishing one or more sacrificial layers over said second capacitor plate layer and thereafter establishing removing said sacrificial layers at a location outside the trench, thereby to expose a portion of said second capacitor plate, and making electrical contact to the second plate layer at said location.

21. The method of claim 13 wherein said steps of forming the plate layers and dielectric layer comprising forming, for each of said layers, respective left and right generally flat portions located within the trench, between and substantially parallel to the side walls of the trench, the left portions being generally parallel to the right portions within the trench.

22. The method of claim 21 wherein said steps of forming the layers include forming, for each of said first plate layer, dielectric layer, and second plate layer, respective upper and lower portions, the upper portions extending generally parallel to and being located above the upper surface of the substrate, the lower portions depending downward from the upper portions into the trench.

23. A memory cell for a dynamic random access memory ("DRAM") integrated circuit comprising:
a substrate having an upper surface;
a trench in said substrate, said trench including a pair of opposing, spaced apart, substantially vertical side walls located below the substrate upper surface;
a capacitor formed within but insulated from said trench, said capacitor including a first plate layer located between and substantially parallel to said side walls of said trench;
a dielectric layer located between the side walls of said trench, over said first plate and substantially parallel thereto;
a second plate layer located between and substantially parallel to said side walls of the trench, and over said dielectric layer; and
a pass transistor having a conductive region formed adjacent to said trench;
a connecting layer located outside the trench;
said second plate layer being coupled electrically by said connecting layer to the conductive region of said pass transistor.

24. The DRAM cell of claim 23 wherein said first and second plate layers comprise polysilicon.

25. The DRAM cell of claim 23 wherein said first plate comprises a field shield layer coupled to a reference potential.

26. The DRAM cell of claim 23 wherein said dielectric layer comprises oxidized silicon nitride.

27. The DRAM cell of claim 23 further including a plug filling the remaining volume of said trench after all other layers are established.

28. The DRAM cell of claim 27 wherein said plug comprises polysilicon.

29. The DRAM cell of claim 27 wherein said plug comprises silicon dioxide.

30. The DRAM cell of claim 23 further including one or more sacrificial layers similarly shaped to and located over said second plate layer, said sacrificial layers being used during further processing of said trench capacitor to facilitate connection of said trench capacitor and a pass transistor.

31. The DRAM cell of claim 30 wherein said connection layer comprises a layer of TiN coupling said second plate layer to a portion of said pass transistor.

32. The DRAM cell of claim 31 further comprising a region of TiSi$_2$ located beneath said connection layer.

33. The DRAM cell of claim 30 wherein said sacrificial layers comprise a polysilicon layer and a silicon oxide layer.

34. The DRAM cell of claim 23 further comprising the step of establishing one or more sacrificial layers over said second capacitor plate layer and thereafter establishing removing said sacrificial layers at a location outside the trench, thereby to expose a portion of said second capacitor plate, and then adding the connection layer making electrical contact to the second plate layer at said location.

35. The DRAM cell of claim 15 wherein said steps of forming the plate layers and dielectric layer comprise forming, for each of said layers, respective left and right generally flat portions located within the trench, between and substantially parallel to the side walls of the trench, the left portions being generally parallel to the right portions within the trench.

36. The DRAM cell of claim 35 wherein said steps of forming the layers include forming, for each of said first plate layer, dielectric layer, and second plate layer, respective upper and lower portions, all of the upper portions extending generally parallel to and above the upper surface of the substrate, the lower portions depending downward from the upper portions into the trench.

37. The DRAM cell of claim 23 wherein each of said first plate layer, dielectric layer, and second plate layer includes respective upper and lower portions, all of the upper portions generally parallel to and above the upper surface of the substrate, the lower portions depending downward from the upper portions into the trench, and wherein said pass transistor includes a gate electrode located above the substrate top surface, the conductive region of the pass transistor being a source/drain region located between the gate electrode and the trench.

38. The DRAM cell of claim 37 wherein said upper portions of the first plate layer, dielectric layer, and second plate layer extend from the trench to a step having a sidewall located near said source/drain region, the cell further comprising a sidewall insulation stick formed of an insulative material, the insulation stick being located at the sidewall, said connecting layer being insulated from the sidewall of the first plate layer by the insulation stick.

39. The DRAM cell of claim 38 wherein said step includes an upper surface formed by the upper surface of the second plate layer, and wherein said sidewall of the step is substantially vertical, the insulation stick having a corresponding substantially vertical sidewall abutting the sidewall of the step, the connecting layer extending from said upper surface of the step onto an outside surface of the insulation stick and onto the source/drain region.

40. The DRAM cell of claim 39 further comprising a second step and a second sidewall insulation stick located thereat, the second insulation stick being on the same side as the trench and closer to the trench than the first-named insulation stick.

41. The DRAM cell of claim 40 further comprising a further dielectric layer located on top of said second plate layer and a layer of polysilicon located on top of said further dielectric layer, the further dielectric layer extending beneath the second insulation stick, the polysilicon layer extending up to an inside wall of the second insulation stick.

42. A method of forming a DRAM cell having a trench capacitor and an associated press transistor comprising the steps of:

forming a trench in a substrate having a top surface, the trench having a pair of opposed side walls descending downward from the top surface;

forming a layer of insulation upon said trench side walls;

forming first and second plate layers for said capacitor separated by a dielectric layer, said plate layers being insulated from the side walls of the trench by said layer of insulation, said plate layers and dielectric layer each having respective generally vertical portions within the trench and respective lateral portions outside the trench, the vertical portions depending vertically downward from the lateral portions, the vertical portions each being substantially parallel to and located between the side walls of the trench, the lateral portions being generally planar and generally parallel to and located above the top surface of the substrate;

establishing a pass transistor with a source/drain region adjacent to the trench and a gate electrode;

exposing an upper surface of the lateral portion of the second plate layer at a location beneath said trench and said pass transistor gate electrode; and establishing an electrically conductive layer coupling said exposed upper surface of said second capacitor plate to said source/drain region.

43. The method of claim 42 further including forming a step in the lateral portions of the first plate layer, dielectric layer, and second plate layer, the step being formed with a sidewall located near said source/drain region, said exposing step including exposing an upper surface of the lateral portion of the second plate layer adjacent to said step sidewall;

forming a sidewall insulation stick of an insulative material located at the sidewall, said electrically conductive layer being insulated from the sidewall of the first plate layer by the insulation stick.

44. The method of claim 43 wherein said step of forming a step includes forming the sidewall of the step substantially vertical, the insulation stick being formed with a corresponding substantially vertical sidewall abutting the sidewall of the step, the conductive layer extending from said upper surface of the step onto an outside surface of the insulation stick and onto the source/drain region.

45. The method of claim 44 further comprising forming a second step and a second sidewall insulation stick located thereat, the second insulation stick being on the same side of and closer to the trench as the first-named insulation stick.

46. The method of claim 45 further comprising forming a further dielectric layer located on top of said second plate layer and forming a layer of polysilicon located on top of said further dielectric layer, the further dielectric layer extending beneath the second insulation stick, the polysilicon layer extending up to an inside wall of the second insulation stick.

47. A trench capacitor for an integrated circuit DRAM on a substrate having a top surface, comprising:

a trench in said substrate, said trench including a pair of opposed, generally parallel side walls descending downward from the top surface;

an insulating layer covering the top surface of said substrate and extending into the trench, covering the inside walls of said trench walls;

a capacitor having three similarly shaped layers, being a first plate layer, a dielectric layer, and a second plate layer, each having upper and lower portions, said upper portions extending above and generally parallel to the top surface of the substrate and connected continuously to the lower portions, said lower portions depending from the upper portions and extending into the trench, and having a generally flat portion parallel to the side walls of the trench, and located completely between the trench side walls, the first plate layer being located adjacent to said insulating layer, said first plate layer being a field shield layer electrically coupled to a source of stable electric potential, the dielectric layer being located between the first plate layer and the second plate layer;

the second plate layer having an upper surface outside said trench;

a layer of a conductive material coupled to said second plate layer upper surface outside the trench.

48. The capacitor of claim 47 further comprising a sacrificial dielectric layer having upper and lower portions, and located upon the second plate layer, and a second sacrificial layer having etched properties similar to the etch properties of the first plate layer.

49. The trench capacitor of claim 47 wherein said upper portions of the first plate layer, dielectric layer, and second plate layer extend from the trench to a step having a sidewall located above the substrate, said second plate upper surface being adjacent to said sidewall, the capacitor further comprising a sidewall insulation stick formed of an insulative material, the insulation stick being located at the sidewall, said conductive material layer being insulated from a sidewall of the first plate layer at said step by the insulation stick.

50. A capacitor for an integrated circuit DRAM on a substrate having a top surface, comprising:

a trench in said substrate, said trench including a pair of opposed, generally parallel side walls descending downward from the top surface;

an insulating layer extending from the top surface of said substrate into the trench, covering the inside walls of said trench walls;

a capacitor located at least partially within said trench, no part of the capacitor being located within the substrate, the capacitor being insulated from the substrate by said insulating layer;

the capacitor having three conformal layers, being a conductive first plate layer, a dielectric layer, and a conductive second plate layer;

the first plate layer being located at least partially in the trench and adjacent to said insulating layer, said first plate being a field shield layer electrically coupled to a reference potential, the dielectric layer being located at least partially in the trench between the first plate layer and the second plate layer, the second plate layer being located at least partially within the trench, being the innermost of the three capacitor layers within the trench, and being coupled to receive a signal representative of data to be stored in the capacitor;

the capacitor being thereby configured so that the signal applied to the second capacitor plate layer is insulated from the trench side walls and from the substrate by the capacitor dielectric and by the reference potential on the first plate layer and by the insulation layer, and the substrate is insulated from the effects of voltage on the second plate layer.

51. The capacitor of claim 50 wherein each of said three capacitor layers and the insulating layer extends out of the trench, whereby the layers have lateral portions and trench portions, the lateral portion of the second plate layer being located above the lateral portions of the other capacitor layers, and wherein a portion of the capacitor is formed above the substrate top surface.

52. The capacitor of claim 51 wherein said trench portions are similarly shaped, and arranged in a stacked configuration.

53. The capacitor of claim 51 further comprising a conductor layer coupled to the lateral portion of the second plate layer so that said second plate layer is coupled to said signal representative of data via said conductive layer.

54. The capacitor of claim 53 further comprising a transistor located outside of the trench, the transistor having a conductive region in the substrate, the conductor layer coupling the second plate layer to the conductive region.

55. A DRAM memory cell comprising:

a trench capacitor in a trench in a substrate;

a transistor formed beside but not within the trench, the transistor selectively coupling data to be stored in the cell to the capacitor;

the trench capacitor having an active plate layer, a dielectric layer, and a field plate layer coupled to a reference potential, the field plate layer also serving to isolate adjacent memory cells, the dielectric layer positioned between the plate layers;

an insulation layer between the field plate layer and the substrate and further located between the field plate and side walls of the trench, the active plate layer being coupled to the transistor, voltages, on the active layer being insulated from the substrate by the field plate layer and the insulating layer.

56. A method of operating a DRAM memory cell comprising the steps of:

actuating a pass transistor thereby to couple a data signal representing data to a trench capacitor from an electrode of the transistor;

impressing the signal on the active plate electrode of the trench capacitor;

isolating the signal from the substrate and side walls of the trench by maintaining a further plate of the capacitor at a reference potential, said further plate being positioned between the active plate electrode and the side walls of the trench, and insulating said further plate from the substrate and the trench side walls by a layer of insulation, so that the signal coupled to the active plate has no effect on the substrate or trench side walls.

* * * * *

UNITED STATES PATENT AND TRADEMARK OFFICE
CERTIFICATE OF CORRECTION

PATENT NO. : 5,075,817

DATED : December 24, 1991

INVENTOR(S) : Douglas Butler

It is certified that error appears in the above-identified patent and that said Letters Patent is hereby corrected as shown below:

```
Col. 3, line 4, "b" should read --be--.
Col. 8, line 27, after "trench", insert a comma.
Col. 8, line 33, after "trench", insert a comma.
Col. 8, line 60, "polyusilicon" should read --polysilicon--.
Col. 8, line 62, "compri" should read --comprises silicon dioxide--.
Col. 9, line 18, "downwardly" should read --downward--.
Col. 9, line 62, after "and", insert --said--.
Col. 10, line 9, "comprising" should read --comprise--.
Col. 10, line 49, after "plate", insert --layer--.
Col. 12, line 4, "press" should read --pass--.
Col. 13, line 33, "etched" should read --etch--.
Col. 13, line 64, after "plate", insert --layer--.
Col. 14, line 49, delete the comma.
```

Signed and Sealed this

Seventh Day of September, 1993

*Attest:*

BRUCE LEHMAN

*Attesting Officer*  Commissioner of Patents and Trademarks